(12) United States Patent
Fedorov (10) Patent No.: US 8,739,856 B2
(45) Date of Patent: Jun. 3, 2014

(54) EVAPORATION-ENHANCED THERMAL MANAGEMENT DEVICES, SYSTEMS, AND METHODS OF HEAT MANAGEMENT

(75) Inventor: Andrei G. Fedorov, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 1261 days.

(21) Appl. No.: 12/215,320

(22) Filed: Jun. 26, 2008

(65) Prior Publication Data

US 2009/0050294 A1 Feb. 26, 2009

Related U.S. Application Data

(60) Provisional application No. 60/956,757, filed on Aug. 20, 2007, provisional application No. 61/051,122, filed on May 7, 2008.

(51) Int. Cl.
*F28F 7/00* (2006.01)
*H05K 7/20* (2006.01)

(52) U.S. Cl.
USPC .................. 165/80.4; 165/104.21; 165/80.3

(58) Field of Classification Search
USPC ............ 165/80.4, 908, 104.33, 80.3, 104.21, 165/109.1; 361/699, 700; 257/714, 715
See application file for complete search history.

(56) References Cited

U.S. PATENT DOCUMENTS

| | | | |
|---|---|---|---|
| 5,131,233 A | 7/1992 | Cray et al. ........................ 62/64 |
| 5,768,103 A * | 6/1998 | Kobrinetz et al. ............ 361/699 |
| 5,854,092 A * | 12/1998 | Root et al. ..................... 438/106 |
| 5,943,211 A * | 8/1999 | Havey et al. ................... 361/699 |
| 6,349,760 B1 * | 2/2002 | Budelman ..................... 165/80.4 |
| 6,955,062 B2 * | 10/2005 | Tilton et al. ................... 62/259.2 |
| 6,955,063 B2 * | 10/2005 | Adiga et al. .................. 62/259.2 |
| 7,362,574 B2 * | 4/2008 | Campbell et al. ............. 361/699 |
| 7,610,769 B2 * | 11/2009 | Tain et al. ..................... 62/259.2 |
| 8,037,926 B2 * | 10/2011 | Martin et al. ................. 165/80.4 |
| 8,051,905 B2 * | 11/2011 | Arik et al. ..................... 165/287 |
| 2007/0119573 A1* | 5/2007 | Mahalingam et al. ....... 165/80.4 |
| 2008/0043440 A1 | 2/2008 | Fedorov |
| 2008/0089029 A1 | 4/2008 | Launay et al. |

OTHER PUBLICATIONS

Bar-Cohen, A., Sherwood, G., Hodes, M., Solbreken, G., Gas-Assisted Evaporative Cooling of High Density Electronic Modules, IEEE Trans. Components, Packaging, and Manufacturing Technology—A, 18 (3), 502-509 (1995).
Morgan, M.J., Chang, W.S., Pais, M.R., Chow, L.C., Comparison of High Heat Flux Cooling Applications, High Heat Flux Engineering, SPIE 1739, 17-28 (1992).
Simons, R. E., Calculation Corner: Estimating the Effect of Flow Bypass on Parallel Plate-Fin Heat Sink Performance, ElectronicsCooling, 10 (1), Feb. 2004.
Heffington, S.N., Black, W.Z., Glezer, A., Vibration Induced Droplet Atomization Heat Transfer Cell for Cooling of Microelectronic Components, Proceedings of InterPack01, K.
Cotler, A.C.; Brown, E.R.; Dhir, V.; Shaw, M.C. "Chip-level spray cooling of an LD-MOSFET RF power Amplifier", IEEE Transactions on Components, Packaging and Manufacturing Tec.

(Continued)

*Primary Examiner* — Tho V Duong
(74) *Attorney, Agent, or Firm* — Thomas | Horstemeyer, LLP (57) ABSTRACT

Briefly described, embodiments of this disclosure include heat management devices, heat management systems, methods of heat management, and the like.

29 Claims, 6 Drawing Sheets
(4 of 6 Drawing Sheet(s) Filed in Color)

(56) References Cited

OTHER PUBLICATIONS

Amon, C.H., Murthy, J.Y., Yao, S.C., Narumanchi, S., Wu, C.F., Hsieh, C.C., MEMS-Based Thermal Management of High-Heat-Flux Devices, EDIFICE: Embedded Droplet Impingement for Integrated Cooling of Electronics, Journal of Experimental Thermal and Fluid Science, 25 (5), 231-242 (2001).

Kim, J. H., You, S. M., and Choi, S. U. S., 2004, "Evaporative Spray Cooling of Plain and Microporous Coated Surfaces," International Journal of Heat and Mass Transfer. 47 (14-16): pp. 3307-3315.

Bash, C.E., Patel, C.D., Sharma, R.K., Inkjet Assisted Spray Cooling of Electronics?, Proceedings of InterPack 03, Maui, Hawaii (2003).

Meacham, J. M., Ejimofor, C., Kumar, S., Degertekin, F. L. and Fedorov, A. G., "A micromachined ultrasonic droplet generator based on a liquid horn structure," Review of Scientific Instruments, 75 (5), 1347-1352 (2004).

Meacham, J. M., Varady, M., Esposito, D., Degertekin, F. L., and Fedorov, A., A micromachined ultrasonic atomizer for liquid fuels, Atomization and Sprays, 18 (2), 163-190 (2008).

Meacham, J. M., Varady, M., Degertekin, F. L., and Fedorov, A., Droplet Formation and Ejection from a Micromachined Ultrasonic Droplet Generator: Visualization and Scaling, Physics of Fluids, 17 (10), 100605-13 (2005).

Forbes, T. P, Degertekin, F. L. and Fedorov, A. G., "Multiplexed Operation of a Micromachined Ultrasonic Droplet Ejector Array," Review of Scientific Instruments, 78 (10), 104101-104106 (2007).

Amon, C. H., Yao, S. C., Wu, C. F., and Hsieh, C. C., 2005, "Microelectromechanical System-Based Evaporative Thermal Management of High Heat Flux Electronics," Journal of Heat.

* cited by examiner

EVAPORATION-ENHANCED THERMAL MANAGEMENT DEVICES, SYSTEMS, AND METHODS OF HEAT MANAGEMENT

CROSS-REFERENCE TO RELATED APPLICATION

This application claims priority to U.S. provisional application entitled, "Evaporation Enhanced, Dynamically Adaptive Heat Sink for Thermal Management of High Heat Dissipation Devices," having Ser. No. 60/956,757, filed on Aug. 20, 2007, which is entirely incorporated herein by reference.

This application also claims priority to U.S. provisional application entitled, "Evaporation Enhanced Heat Sink," having Ser. No. 61/051,122, filed on May 7, 2008, which is entirely incorporated herein by reference.

BACKGROUND

In the course of the past few years, the problem of removing heat resulting from operation of electronic devices has grown from being an important concern to becoming a widely recognized bottleneck that limits further progress of high performance microelectronics. Excessive heating affects not only the performance, but also the reliability of computer chips. With a continuing increase in levels of integration and the introduction of new chip and interconnect architectures, the challenge of microelectronics cooling has reached a new heights. Not only have background heat fluxes begun to reach record high values ($\sim 100$ W/cm$^2$), but "hot spots" are observed where local heat fluxes exceed several times that found at the background. The air-cooled heat sink has been and remains the main workhorse of the electronic cooling industry. The simplicity and low cost of operation combined with abundance and environmental friendliness of the coolant makes air-cooling uniquely appealing as a first-to-go-approach to thermal management. To overcome the inferiority of air as a heat transfer fluid, over the years the design of air-cooled heat sinks evolved to a staggering level of sophistication with a main goal of providing the highest possible surface area for convective heat transfer in a smallest package and with the lowest possible pressure drop (pumping power) requirement. It should be noted that despite an increasing interest and push towards adaptation of liquid cooling, the air-cooled heat sinks will never be destined to disappear from the research landscape. This is simply because ultimate heat rejection to ambient environment, even in the case of liquid cooling or refrigeration, occurs at the liquid chiller/condenser with an air side of the heat exchanger often defining the overall system size and performance. Finally, to push the limits of air-cooled heat sinks an increased attention has been recently given to two important practical aspects of heat sink design and operation.

First is an issue of the coolant bypass when air introduced into the heat sink avoids traveling through a finned (i.e., active heat transfer) zone, but instead takes the path of minimal hydraulic resistance around and above the heat sink. This scenario has been recently evaluated showing that air bypass results in a rather dramatic increase in the heat sink thermal resistance, which more than doubles with an increase in the number of fins. The second important design aspect concerns evaluation of heat sink performance normalized by the heat sink size and weight. An increase in dissipated heat loads translates into a need for greater heat transfer area, and thus bigger and heavier heat sinks.

Despite technological maturity of air cooling, the art and science of air-cooled heat sink design continues to blossom with innovative ideas pushing the boundaries of performance envelope to their new heights. The most promising avenue for innovation appears to be in exploring and exploiting various methods of active augmentation targeting the two performance-limiting factors—the air throughput enabled by a fan and effective heat transfer coefficients. Synthetic jets and piezoelectric fans are two recent examples of the successful attack on a problem of the air throughput and limited heat storage capacity of cooling air. Specifically, significant performance improvements have been realized by increasing ambient "cold" air delivery, enhanced mixing, and "warm" air rejection using active (actuator-driven) devices: forced flexing of a perforated diaphragm in the case of synthetic jet and piezo-driven flapping of a blade in the case of the piezoelectric fan. This is done in combination with the extended heat transfer surfaces provided by the conventional heat sinks, and with no increase in pressure drop (pumping power) penalty. Another recent interesting idea to augment air throughput through the heat sink exploits gas ion generation by emission from field-enhancing nanostructures, resulting in the microscale ion-driven air flow.

In complimentary efforts, important advances are being made in developing means for enhancing the convective heat transfer coefficient of air cooling. In particular, new twists on a general idea of gas assisted evaporation cooling (Sherwood, G. and Cray, S., "Gas-liquid forced turbulence cooling", U.S. Pat. No. 5,131,233, 1992) have been recently described. In one approach, called perspiration nanopatch, enhanced evaporation from a capillary-confined thin liquid film subjected to a high velocity dry gas (air) streaming is exploited (Fedorov, A. G., "Nano-Patch Thermal Management Devices, Methods, and Systems", U.S. patent application having Ser. No. 11/748,540), allowing for dissipation of heat fluxes approaching 500 W/cm$^2$.

In another approach, surface of the heat sink is modified with a sorption material and is cyclically exposed to cold/dry or warm/wet air streams, resulting in thermo-chemical (desorption-based) enhancement of total dissipated heat fluxes as compared to the air cooling alone (Launay, S., Fedorov, A. G., and Joshi, Y., "Thermal Management Devices, Systems, and Methods", U.S. patent application having Ser. No. 11/867, 070).

Finally, it has been recently shown that forced convective liquid cooling can be utilized in combination with air cooling in a hybrid heat sink configuration to provide for synergetic heat removal at different rates from different domains of the microprocessor with the possibility of internal regeneration of the liquid coolant via heat exchange with air (Fedorov, A. G., "Fluid-to-Fluid Spot-to-Spreader Heat Management Devices and Systems and Methods of Managing Heat", U.S. Patent App. having Ser. No. 60/954,360).

BRIEF DESCRIPTION OF THE DRAWINGS

Many aspects of this disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

The patent or application file contains at least one drawing executed in color. Copies of this patent or patent application publication with color drawing(s) will be provided by the Office upon request and payment of the necessary fee.

FIGS. 5a-5c illustrate realized ejector assembled for testing.

FIG. 6a illustrates a process flow of an embodiment of the present disclosure. FIG. 6b illustrates scanning electron micrographs (SEMs) of cross sections of orifices etched in both bulk silicon and a silicon nitride membrane, and of top and bottom views of a nozzle array.

FIGS. 7a-7c illustrates the characterization of ejector operation.

FIG. 8a illustrates the experimental setup used to demonstrate the multiplexed operation of a dual-sample/domain micromachined ultrasonic droplet ejector array. FIG. 8b illustrates the images of isolated ejection from individual domains of the multiplexed ultrasonic ejector array: top) left domain active and bottom) right domain active.

FIG. 9a is a digital image of a fan with ducted outlet directing air flow through the fins of an aluminum heat sink that is placed above the ejector assembly. FIG. 9b is a digital image of a view from beneath the heater/heat sink assembly showing the cutout where ejected droplets are entrained in the air flow. FIG. 9c is a diagram of the heater location and thermocouple traces.

SUMMARY

Briefly described, embodiments of this disclosure include heat management devices, heat management systems, methods of heat management, and the like. One exemplary thermal management device, among others, includes: a heat dissipater structure disposed on a portion of a heat source structure, wherein the thermal energy from the heat source structure being able to heat at least a portion of the heat dissipater structure, wherein the heat dissipater structure has a heat dissipater surface; a fluid dispenser system adapted to direct fluid droplets towards the heat dissipater structure; and a gas flow system adapted to direct a gas towards the heat dissipater structure, wherein the gas being able to entrain the fluid droplets to form a gas/fluid droplet mixture, wherein the gas/fluid droplet mixture contacts the heat dissipater surface to dispose the fluid droplets onto the heat dissipater surface, and wherein the thermal energy from the heat dissipater surface is capable of being dissipated upon evaporation of the fluid droplets.

One exemplary dissipating heat in a heat source structure, among others, includes: disposing a thermal management device adjacent the heat source structure, wherein the thermal management system includes: a heat dissipater structure disposed on a portion of the heat source structure, wherein the thermal energy from the heat source structure heats at least a portion of the heat dissipater structure, wherein the heat dissipater structure has a heat dissipater surface, a fluid dispenser system adapted to direct fluid droplets towards the heat dissipater structure, and a gas flow system adapted to direct a gas towards the heat dissipater structure; entraining the fluid droplets in the gas to form a gas/fluid droplet mixture; and direct the gas/fluid droplet mixture towards the heat dissipater structure, wherein the gas/fluid droplet mixture contacts the heat dissipater surface and the fluid droplets are disposed onto the heat dissipater surface, and wherein the thermal energy from the heat dissipater surface is dissipated and causes the fluid droplets to evaporate.

DETAILED DESCRIPTION

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of physics, thermodynamics, heat transfer, chemistry, material science, and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is in atmosphere. Standard temperature and pressure are defined as 25° C. and 1 atmosphere.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

As used herein, the term "adjacent" refers to the relative position of one or more features or structure, where such relative position can refer to being near or adjoining. Adjacent structures can be spaced apart from one another or can be in actual contact with one another. In some instances, adjacent structures can be coupled to one another or can be formed integrally with one another.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Discussion

Thermal management (also referred to as "evaporation enhanced thermal management") devices, systems, and methods of heat management, are disclosed. Embodiments of the present disclosure provide for thermal management schemes that seamlessly integrate cooling approaches on the global (e.g., package) level. Embodiments of the present disclosure address the thermal management challenges associated with high power dissipation devices. Embodiments of the present disclosure enable significant enhancement of conventional air-cooled heat sinks using on-demand and/or spatially controlled fluid droplet impingement evaporative cooling. Embodiments of the device architecture modifies an air (gas)-cooled heat sink by adding a fluid dispensing system as a capping surface of a heat source structure (heat sink). Such a minimal modification of the heat sink allows one to exploit high heat flux due to evaporative cooling by virtue of delivering fluid droplets to the highly thermally conducting, heat spreading surface of the heat dissipater structure (e.g., heat sink fins). The phase change associated with fluid droplet evaporation results in significant (in an embodiment, about 50% or more) enhancement of the dissipated thermal load, beyond what could be achieved by using air (gas) cooling alone. Finally, among the additional attractive features of the present disclosure is its ease of implementation (i.e., modification of commercially available heat sinks), paving the way to power-efficient, low-cost thermal management of high power dissipation devices. The system (droplet ejection) can be activated on demand (e.g., on/off or at increased/decreased rate) to enable matching of the cooling level to dynamically (changing in time) power dissipation demands.

Embodiments of the present disclosure provide a fundamentally different approach to air/gas cooling enhancement as described above. An embodiment of the present disclosure takes advantage of mist impingement cooling with evaporation of ultra-fine droplets generated by a liquid atomization array and delivered to the active (fin) heat transfer surface of the heat sink by the primary air flow supplied by the fan. In an embodiment, the planar atomization device is placed on top of the heat sink, thus effectively forming a capping lid preventing parasitic air bypass of the heat sink finned area. It should be noted that in contrast to using gas/air flow to assist evaporative cooling (the approach taken in prior art described above), embodiments of the present disclosure utilize evaporation to assist gas/air cooling and describes the systems and methods of removing thermal energy.

Figures 1, 2:
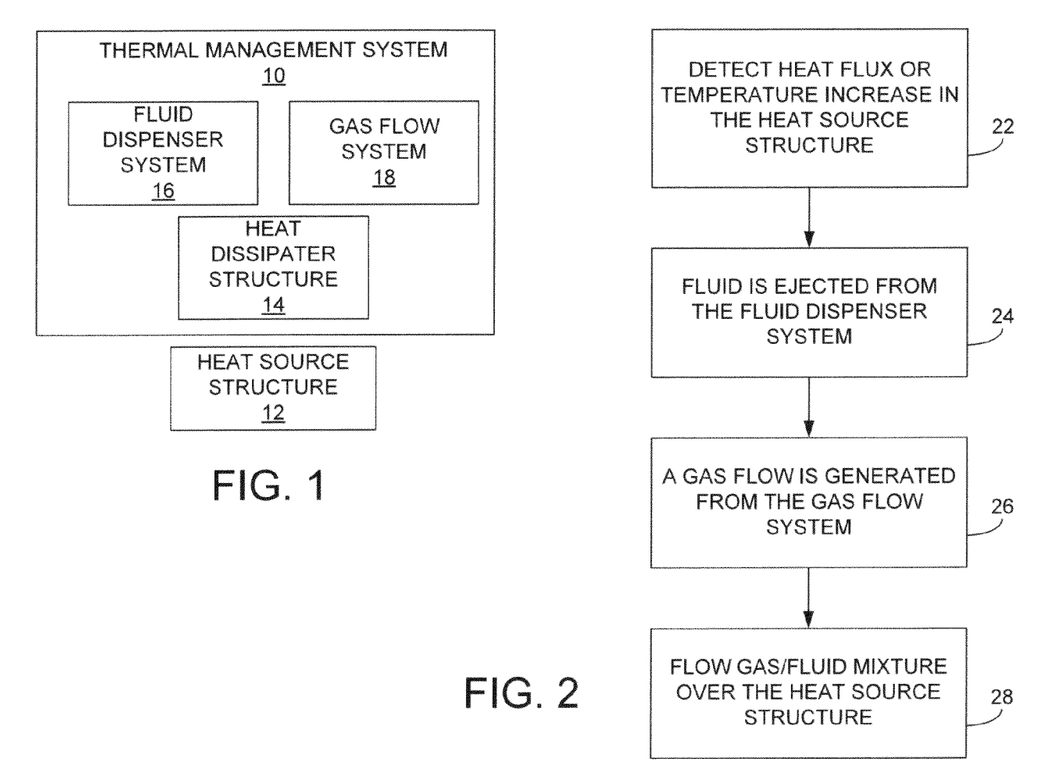
FIG. 1 illustrates a block diagram of an embodiment of the heat management device or system of the present disclosure.
FIG. 2 illustrates a flow chart of an embodiment of a method of heat management.

As shown in FIG. 1, embodiments of the heat management device or system 10 include a heat dissipater structure 14, a fluid dispenser system 16, and a gas flow system 18. In addition, a heat source structure 12 is adjacent (e.g., disposed directly upon or indirectly upon so that the heat from the heat source structure 12 is thermally communicated (e.g., exchange heat) with the heat dissipater structure 14) the heat dissipater structure 14. The heat dissipater structure 14 functions to remove heat from the entire or substantially the entire area of the heat source structure 12. The fluid dispenser system 16 and the gas flow system 18 work together to remove heat from the heat dissipater structure 14 using a combination of gas flow and fluid evaporation; additional details will be discussed below. In an embodiment, the heat management system 10 includes two or more heat dissipater structures, two or more fluid dispenser systems, and/or two or more gas flow systems. Embodiments of the heat management device or system 10 can include, but are not limited to, connecting pipes, valves, fluid pumps, fans, temperature sensors, flow rate and pressure sensors or meters, heat flux sensors, and interface/packaging materials. The heat management device or system 10 can be an open loop system (e.g., use air from environment and fluid from reservoir and exhausting the mixture of air and fluid vapor to the ambient) or a closed loop system (collect the mixture of gas and fluid vapor at the exhaust from the heat sink, chill the mixture to condense the fluid and separate it from the gas, and re-circulate gas and/or fluid back to the inlet of the heat sink).

The heat source structure 12 can be a structure such as, but not limited to, a computer chip, an electronic component, a display, an engine, a fuel cell or other power generation device (e.g., solar cell), a chemical reactor, a light source, and the like. The heat from the heat source structure 12 can be monitored so that the heat management device or system 10 can be properly activated and operated.

The heat dissipater structure 14 is disposed (e.g., directly (in direct contact) or indirectly (in indirect contact (e.g. an interface structure disposed between the structures or connected via a thermal conduit such as, for example, the heat spreader, heat pipe, thermosyphon, or the like))) on a portion of or over the entirety of the heat source structure 12. In an embodiment, the heat dissipater structure 14 can be a heat sink for a heat source structure such as a computer chip. The heat dissipater structure 14 may include fins, pin-fin arrays, or other extended surfaces commonly used for heat transfer enhancement. In an embodiment, the surface of the heat dissipater structure 14 can include a layer of material that enhances the spreading of the fluid droplets on the surface of the heat dissipater structure and/or heat transfer from heat dissipater structure to the fluid droplet.

The heat dissipater structure 14 can be made of solid or porous materials (preferably with high thermal conductivity) such as, but not limited to, copper, aluminum, silicon, diamond, steel, carbon, different polymers, or composite materials, and combinations thereof.

It should be noted that two or more layers of heat dissipater structures could be used to enhance heat dissipation and spreading capabilities. In addition, two or more layers of heat dissipaters can be used to dissipate heat in vertically integrated packages such as three-dimensional computer die stacks.

As noted above, the fluid dispenser system 16 and the gas flow system 18 work together to remove heat from the heat dissipater structure 14 using a combination of gas flow and fluid evaporation. The fluid dispenser system 16 includes a reservoir configured to store a fluid. The fluid may be a conductive or a dielectric liquid (e.g., water or liquid refrigerant). In an embodiment, the fluid is water. The fluid dispenser system 16 also includes an ejector system in fluidic communication with the reservoir. The ejector system is configured to generate and eject fluid droplets. The term "fluid droplets" includes droplets or jets of fluid ejected from the ejector system. In an embodiment, the fluid droplets can be atomized using the ejector system. In an embodiment, the fluid droplet can be ejected perpendicular or substantially (e.g., ±10 degrees) perpendicular to the gas flow.

In an embodiment, the fluid can be atomized and made into fluid droplets using a planar ejector array structure that employs an atomization system such as, but not limited to, air-assisted atomization, pressure-swirl atomization, ink-jet atomization, thermal bubble atomization, ultrasonically driven atomization, and combinations thereof.

One particular embodiment that enables low power input atomization is resonant, ultrasonically driven atomization, which operates by providing an AC electrical signal to the actuator (e.g., piezoelectric transducer) with a frequency equal to the resonance of the fluid filled cavity (reservoir and set of ejector structures). The resonant acoustic wave in the fluid is focused by the ejector structure (e.g., pyramidal nozzles), creating a high pressure gradient at the ejector structure nozzle exit, and thus ejecting a droplet at every cycle of the acoustic wave. Since the ejector structures can be fabricated using micromachining techniques the orifice size is well controlled, resulting in mono-disperse droplet ejection for precise flow rate control. Additional details regarding ultrasonically driven atomization are described in reference to FIGS. 4-8 and publications (Meacham, J. M., Ejimofor, C., Kumar, S., Degertekin F. L., and Fedorov, A., 2004, "A Micromachined Ultrasonic Droplet Generator Based on Liquid Horn Structure", *Review of Scientific Instruments*, Vol. 75, No. 5, pp. 1347-1352; Meacham, J. M., Varady, M., Degertekin F. L., and Fedorov, A., 2005, "Droplet Formation and Ejection from a Micromachined Ultrasonic Droplet Generator: Visualization and Scaling", *Physics of Fluids*, Vol. 17, No. 10, pp. 100605-100613; Meacham, J. M., Varady, M., Esposito, D., Degertekin, F. L., and Fedorov, A., "A Micromachined Ultrasonic Atomizer For Liquid Fuels", *Atomization and Sprays*, 18, pp. 163-190 (2008); Forbes, T. P., Degertekin, F. L., and Fedorov, A., Multiplexed operation of a micromachined ultrasonic droplet ejector array, *Review of Scientific Instruments*, Vol. 78 (No. 10), pp. 104101-104106 (2007)), each of which is incorporated herein by reference for the corresponding discussion. In another embodiment, a compacitive actuator can be used in place of the piezoelectric actuator.

Air-assisted atomization includes streams of air (or another gas) that are used to break up a thin liquid film of a fluid into droplets and carry them from the surface (See, Development of Micro-Machining Techniques for Air-Assisted Liquid Atomization, *Exp. Therm. Fluid Sci.*, vol. 20, 11-18, 1999, which is incorporated herein by reference for the corresponding discussion).

Pressure-swirl atomization, which is commonly used in gas turbines, includes a liquid that flows tangentially into a circular chamber from the outer edge and exits from a small orifice in the center of the chamber as a cone of droplets (See, Micromachined Silicon Fuel Atomizers for Gas Turbine Engines, *Atom. Sprays*, vol. 8, pp. 405-418, 1998, which is incorporated herein by reference for the corresponding discussion).

The gas flow system 18 can include one or more fans, a compressed gas injector, air amplifiers, synthetic jets, piezoelectric fans, ion-driven flows, or the like, that blow a gas (e.g., air) towards the heat dissipater structure 14. In an embodiment, the fan is positioned perpendicular or substantially perpendicular (e.g., ±10 degrees) to the ejection of the fluid droplets. In another embodiment, the fan is not positioned or substantially perpendicular (e.g., ±10 degrees) to the ejection of the fluid droplets.

The gas flow system 18 directs the gas flow so that it entrains the fluid droplets that are ejected from the fluid dispenser system 16 to form a gas/fluid droplet mixture. The gas/fluid mixture flows across and/or through the features of the heat dissipater structure 14 so that the gas/fluid droplet mixture contacts the surface of the heat dissipater structure 14.

The heat from the heat source structure 12 heats (e.g., directly (in direct contact) or indirectly (in indirect contact via thermal interface material)) the heat dissipater structure 14. The fluid droplets that contact the heat source structure dissipate heat from the heat source structure via evaporation of the fluid droplets. In other words, the heat from the heat source structure is thermally communicated to the fluid droplets via contact with the heat dissipater structure. The gas flow causes the evaporated fluid to flow away from the heat dissipater structure 14 so that a continuous flow of gas and gas/fluid droplets flow across, around, adjacent, and/or through the features of the heat dissipater structure 14 and contacting fluid droplets with the surface of the heat dissipater structure 14 to continually remove heat from the heat dissipater structure 14.

FIG. 2 is a flow chart describing a method 20 of heat removal using embodiments of the present disclosure. Block 22 states that an increased temperature or a heat flux has been detected or it has been previously determined that an increased temperature or a heat flux will be generated upon operation of the heat source structure. The increase in temperature can be detected by a thermocouple or another temperature sensing device located in close proximity to the heat source structure. In addition, or in the alternative, the increased temperature or heat flux of the heat source structure can be determined through previous experimentation or can be correlated with other measured activities (e.g., electrical, chemical, and others) of the heat source structure. Block 24 states that fluid is ejected from the fluid dispenser system. Block 26 states that a gas flow is generated from the gas flow system. Block 28 states fluid droplets are entrained in a gas to form a gas/fluid droplet mixture. The gas/fluid mixture is directed towards the heat dissipater structure so that the gas/fluid droplet mixture contacts the heat dissipater structure surface and the fluid droplets are disposed onto the heat dissipater surface. The heat from the heat dissipater structure surface causes the fluid droplets to evaporate. The evaporation of the fluid droplets removes heat from the heat dissipater. The evaporated fluid can be removed by the gas flow. The system can be a closed loop system or an open loop system.

Figure 3:
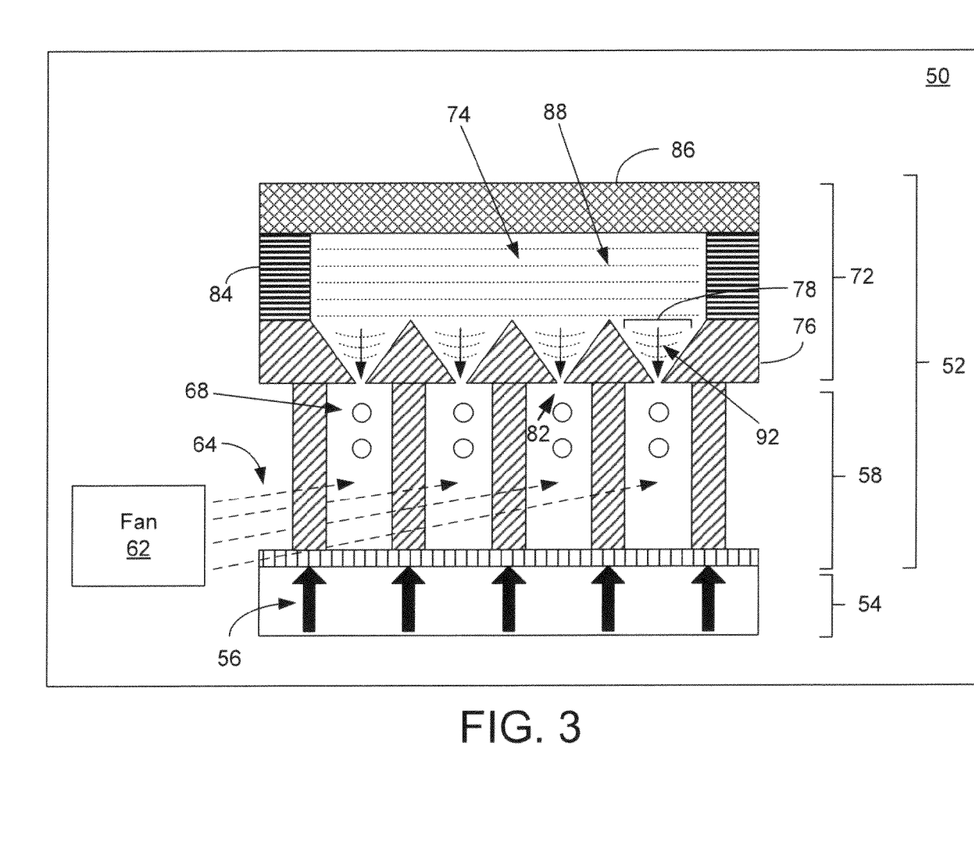
FIG. 3 illustrates an embodiment of a structure including a heat management device or system and a heat source structure of the present disclosure.

FIG. 3 illustrates an embodiment of a structure 50 including a heat management device or system 52 and a heat source structure 54. The heat dissipater structure 58 is disposed on the heat source structure 54. It should be noted that the heat dissipater structure 58 may or may not be disposed over the entire surface of the heat source structure 54. As mentioned above, the heat source structure 54 produces heat 56 that can be dissipated by the heat management device or system 52. In particular, the heat 56 from most of the heat source structure 54 is thermally coupled to the heat dissipater structure 58.

A fan 62 flows a gas 64 (e.g., air) across the heat dissipater structure 58. The gas 64 entrains fluid droplets 68 ejected from the fluid dispenser system 72 to form a gas/fluid droplet mixture. As noted above, the fluid droplets 68 are disposed on the heat dissipater structure 58, absorb heat from the heat dissipater structure 58, and evaporate to remove the heat from the heat dissipater structure 58.

As noted above, fluid droplets 68 are ejected from the fluid dispenser system 72. The fluid dispenser system 72 includes a reservoir 74 and a planar ejector array structure 76. A specific non-limiting embodiment of the planar ejector array structure 76 is described in FIG. 3. Although FIG. 3 refers to ultrasonically driven atomization, the embodiment described in FIG. 3 could use one or a combination of atomization techniques described above. Thus, embodiments of the present disclosure are not limited to the use of ultrasonically driven atomization, but rather embodiments of the present disclosure include the use of other atomization techniques such as those described herein. The use of ultrasonically driven atomization in reference to FIG. 3 illustrates embodiments of how the heat management device operates and this operation can be extended to the understanding of how other atomization techniques operate in embodiments of the heat management device.

The fluid dispenser system 72 includes, but is not limited to, a planar ejector array structure 76 including ejector structures 78, an ejector nozzle 82, a separating layer 84, a reservoir 74, and an actuator 86. A fluid (e.g., water) can be disposed in the reservoir 74 and in the planar ejector array structure 76 of ejector structures 78. Upon actuation of the actuator 86, a resonant ultrasonic wave 88 can be produced within the reservoir 74 and the fluid (not shown). The resonant ultrasonic wave 88 couples to and transmits through the fluid and is focused by the ejector structures 78 to form a pressure gradient 92 within the ejector structure 78. The high-pressure gradient 92 forces fluid out of the ejector structure 78 producing fluid droplets 68. The frequency of the drive signal applied to the actuator 86 dictates, at least in part, the rate at which the fluid droplets 68 are discretely produced. In other words, the fluid droplets 68 are produced either discretely (e.g., drop-on-demand), or as a continuous jet.

A drop-on-demand ejection can be achieved by modulation of the actuation signal in the time domain. The actuator 86 generating ultrasonic waves can be excited by a finite duration signal with a number of sinusoidal cycles (a tone burst) at the desired frequency. Once a certain energy level is reached for droplet ejection, during the initial cycles of this signal, the standing acoustic wave pattern in the resonant cavity is established and the energy level is brought up to the ejection threshold. The number of cycles required to achieve the threshold depends on the amplitude of the signal input to the wave generation device and the quality factor of the cavity resonance. After the threshold is reached, one or more fluid droplets 68 can be ejected in a controlled manner by reducing the input signal amplitude after the desired number of cycles. This signal can be used repetitively, to eject a large number of fluid droplets 68. Another useful feature of this operation is to reduce the thermal effects of the ejection, since the device can cool off when the actuator 86 is turned off between consecutive ejections. The ejection speed can also be controlled by the amplitude and duration of the input signal applied to the actuator 86.

The planar ejector array structure 76 can include, but is not limited to, an ejector nozzle 82 and an ejector structure 78. In general, the material that the planar ejector array structure 76 is made of has substantially higher acoustic impedance as compared to the fluid. The planar ejector array structure 76 can be made of materials such as, but not limited to, single crystal silicon (e.g., oriented in the (100), (010), or (001) direction), metals (e.g., aluminum, copper, and/or brass), plastics, silicon oxide, silicone nitride, and combinations thereof.

The ejector structure 78 can have a shape such as, but not limited to, conical, pyramidal, or horn-shaped with different cross-sections. In general, the cross-sectional area is decreasing (e.g., linear, exponential, or some other functional form) from a base of the ejector nozzle 82 (broadest point adjacent the reservoir 74) to the ejector nozzle 82. The cross sections can include, but are not limited to, a triangular cross-section (as depicted in FIG. 3), and exponentially narrowing. In an embodiment, the ejector structure 78 is a pyramidal shape.

In an embodiment, the ejector structure 78 has acoustic wave focusing properties in order to establish a highly-localized, pressure maximum substantially close to the ejector nozzle 82. This results in a large pressure gradient at the ejector nozzle 82 since there is effectively an acoustic pressure release surface at the ejector nozzle 82. Since the acoustic velocity is related to the pressure gradient through Euler's relation, a significant momentum is transferred to the fluid volume close to the ejector nozzle 82 during each cycle of the acoustic wave in the ejector structure 78. When the energy coupled by the acoustic wave in the fluid volume is substantially larger than the restoring energy due to surface tension, viscous friction, and other sources, the fluid surface is raised from its equilibrium position. Furthermore, the frequency of the waves should be such that there is enough time for the droplet to break away from the surface due to instabilities.

In an embodiment, the ejector structure 78 has a diameter (at the base) of about 50 micrometers to 5 millimeters, about 300 micrometers to 1 millimeter, or about 600 micrometers to 900 micrometers. The distance (height) from the ejector nozzle 82 to the broadest point in the ejector structure 78 is from about 20 micrometers to 4 millimeters, about 200 micrometers to 1 millimeter, or about 400 micrometers to 600 micrometers.

The ejector nozzle 82 size and shape effectively determine the droplet size and the amount of pressure focusing along with the ejector structure 78 geometry (i.e., cavity geometry). The ejector nozzle 82 can be formed using various micromachining techniques as described below and can have a shape such as, but not limited to, circular, elliptic, rectangular, and rhombic. The ejector nozzle 82 has a diameter of about 50 nanometers to 50 micrometers, about 200 nanometers to 30 micrometers, or about 1 micrometer to 10 micrometers.

As noted above, the planar ejector array structure 76 can include one ejector nozzle 82 (not shown), an (one-dimensional) array of ejector nozzles 82 (not shown), or a (two dimensional) matrix of parallel arrays of ejector nozzles 82. As shown in FIG. 3, the ejector structure 78 can include one ejector nozzle 82 each or include a plurality of ejector nozzles 82 in a single ejector structure 78.

The separating layer 84 is disposed between the planar ejector array structure 76 and the actuator 86. The separating layer 84 can be fabricated of a material such as, but not limited to, silicon, metal, rubber, and plastic. The separating layer 84 is from about 50 micrometers to 5 millimeters in height (i.e., the distance from the actuator 42 to the planar ejector array structure 22), from about 200 micrometers to 3 millimeters in height, or from about 500 micrometers to 1 millimeter in height.

The reservoir 74 is substantially defined by the separating layer 84, the planar ejector array structure 76, and the actuator 86. In general, the reservoir 74 and the ejector structures 78 include the fluid. The reservoir 74 is an open area connected to the open area of the ejector structures 78 so that fluid flows between both areas. In addition, the reservoir 74 can also be in fluidic communication (not shown) with microfluidic structures capable of flowing fluid into the reservoir 74.

In general, the dimensions of the reservoir 74 and the ejector structure 78 can be selected to excite a cavity resonance in the fuel cell at a desired frequency. The structures may have cavity resonances of about 100 kHz to 100 MHz, depending, in part, on fluid type and dimensions and cavity shape, when excited by the actuator 86.

In an embodiment, where the heat source structure is a chip, the dimensions of the reservoir 74 are about 100 micrometers to 10 centimeters in width, about 100 micrometers to 10 centimeters in length, and about 100 nanometers to 5 centimeters in height. In addition, the dimensions of the reservoir 74 are about 100 micrometers to 5 centimeters in width, about 100 micrometers to 5 centimeters in length, and about 1 micrometer to 3 millimeters in height. Further, the dimensions of the reservoir 74 are about 200 micrometers to 1 centimeter in width, about 200 micrometers to 1 centimeter in length, and about 100 micrometers to 2 millimeters in height.

The actuator 86 produces a resonant ultrasonic wave 88 within the reservoir 74 and fluid. As mentioned above, the resonant ultrasonic wave 88 couples to and transmits through the liquid and is focused by the ejector structures 78 to form a pressure gradient 92 within the ejector structure 78. The high-pressure gradient 92 accelerates fluid out of the ejector structure 78 to produce fluid droplets 68. The fluid droplets 68 are produced discretely in a drop-on-demand manner. The frequency in which the fluid droplets 68 are formed is a function of the drive cycle applied to the actuator 86 as well as the fluid, reservoir 74, planar ejector array structure 76, and the ejector nozzle 82.

An alternating voltage is applied (not shown) to the actuator 86 to cause the actuator 86 to produce the resonant ultrasonic wave 88. The actuator 86 can operate at about 100 kHz to 100 MHz, about 500 kHz to 15 MHz, or about 800 kHz to 5 MHz. A direct current (DC) bias voltage can also be applied to the actuator 86 in addition to the alternating voltage. In embodiments where the actuator 86 is piezoelectric, this bias voltage can be used to prevent depolarization of the actuator 86 and also to generate an optimum ambient pressure in the reservoir 74. In embodiments where the actuator 86 is electrostatic, the bias voltage is needed for efficient and linear operation of the actuator 86. Operation of the actuator 86 is optimized within these frequency ranges in order to match the cavity resonances, and depends on the dimensions of and the materials used for fabrication of the reservoirs 74 and the planar ejector array structure 76 as well the acoustic properties of the fluids inside the ejector.

The actuator 86 can include, but is not limited to, a piezoelectric actuator and a capacitive actuator. The piezoelectric actuator and the capacitive actuator are described in X. C. Jin, I. Ladabaum, F. L. Degertekin, S. Calmes and B. T. Khuri-Yakub, "Fabrication and Characterization of Surface Micromachined Capacitive Ultrasonic Immersion Transducers", IEEE/ASME Journal of Microelectromechanical Systems, 8, pp. 100-114, 1999 and Meacham, J. M., Ejimofor, C., Kumar, S., Degertekin F. L., and Fedorov, A., "A Micromachined Ultrasonic Droplet Generator Based on Liquid Horn Structure", Rev. Sci. Instrum., 75 (5), 1347-1352 (2004), each of which are incorporated herein by reference for the corresponding discussion.

The dimensions of the actuator 86 depend on the type of actuator used. For embodiments where the actuator 86 is a piezoelectric actuator, the thickness of the actuator 86 is determined, at least in part, by the frequency of operation and the type of the piezoelectric material. The thickness of the piezoelectric actuator is chosen such that the thickness of the actuator 86 is about half the wavelength of longitudinal waves in the piezoelectric material at the frequency of operation. Therefore, in case of a piezoelectric actuator, the dimensions of the actuator 86 are about 100 micrometers to 10 centimeters in width, about 10 micrometers to 1 centimeter in thickness, and about 100 micrometers to 10 centimeters in length. In addition, the dimensions of the actuator 86 are about 100 micrometers to 5 centimeters in width, about 10 micrometers to 5 millimeters in thickness, and about 100 micrometers to 5 centimeters in length. Further, the dimensions of the actuator 86 are about 100 micrometers to 1 centimeter in width, about 10 micrometers to 2 millimeters in thickness, and about 100 micrometers to 1 centimeter in length.

In embodiments where the actuator 86 is an electrostatic actuator, the actuator 86 is built on a wafer made of silicon, glass, quartz, or other substrates suitable for microfabrication, where these substrates determine the overall thickness of the actuator 86. Therefore, in case of a microfabricated electrostatic actuator, the dimensions of the actuator 86 are about 100 micrometers to 10 centimeters in width, about 10 micrometers to 2 millimeter in thickness, and about 100 micrometers to 10 centimeters in length. In addition, the dimensions of the actuator 86 are about 100 micrometers to 5 centimeters in width, about 10 micrometers to 1 millimeter in thickness, and about 100 micrometers to 5 centimeters in length. Further, the dimensions of the actuator 86 are about 100 micrometers to 1 centimeter in width, about 10 micrometers to 600 micrometers in thickness, and about 100 micrometers to 1 centimeter in length.

In various embodiments, the ejector or ejector array can be operated in multiplexed format with a sub-set of ejectors operating in-phase, out-of-phase, or with a desired phase-lag, or a sub-set of ejectors can be OFF (not active) while others being ON (active), or operating with optimally selected duty cycle to match transient profile of power dissipation, as well as non-uniform spatial distribution of the dissipated power load. For example, embodiments of the present disclosure can match the fluid droplet ejection to the thermal energy dissipation as a function of time and/or location on the heat source structure.

EXAMPLES

Now having described the embodiments of evaporation enhanced thermal management devices, systems, and methods of heat management, in general, the examples describe some additional embodiments of the present disclosure. While embodiments of present disclosure are described in connection with the examples and the corresponding text and figures, there is no intent to limit embodiments of the present disclosure to this description. On the contrary, the intent is to cover all alternatives, modifications, and equivalents included within the spirit and scope of embodiments of the present disclosure.

Example 1

Introduction

To address the thermal management challenges associated with high power dissipation devices, this Example describes a novel hybrid thermal management device, which enables significant enhancement of conventional air-cooled heat sinks using on-demand and spatially controlled droplet/jet impingement evaporative cooling. The device architecture modifies an air (gas)-cooled heat sink by adding a multiplexed, planar MEMS (microelectromechanical system)-based droplet ejector array as a capping surface of the finned structure of a conventional heat sink. Such a minimal modification of the heat sink allows one to exploit high heat flux evaporative cooling by virtue of delivering streams of liquid droplets or jets to the highly thermally conducting, heat spreading surface of the heat sink fins. The phase change associated with liquid droplet evaporation results in significant (~50%) enhancement of the dissipated thermal load, beyond what could be achieved by using air (gas) cooling alone. Finally, among the additional key attractive features of the described technology is its ease of implementation (i.e., modification of commercially available heat sinks), paving the way to power-efficient, low-cost thermal management of high power dissipation devices.

Device Design and Development
Concept of the Cooling System

Figure 4:
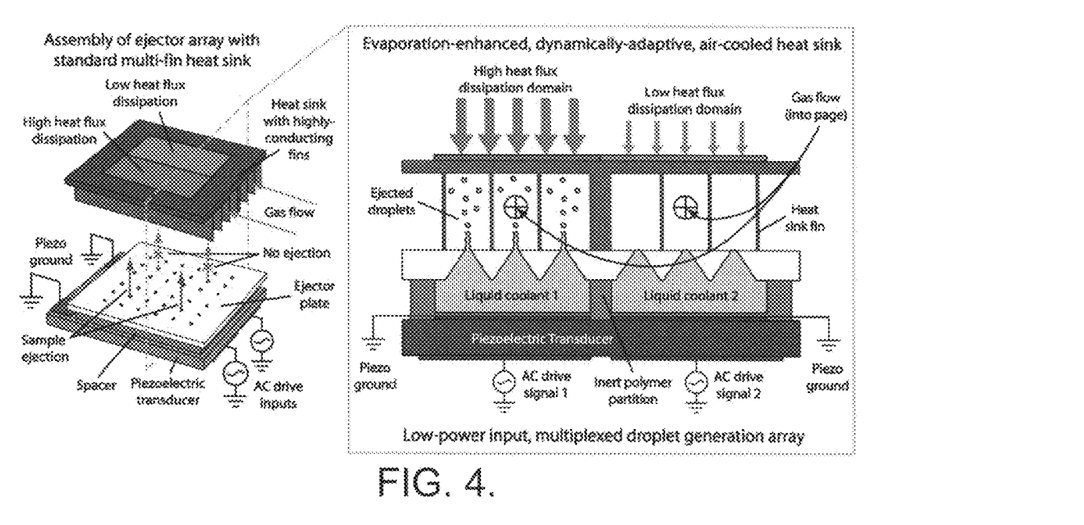
FIG. 4 is a schematic (perspective (left) and cross-section (right)) of a representative embodiment of the evaporation-enhanced, dynamically-adaptive hybrid heat sink where air cooling is enhanced by evaporating droplets generated by an ultrasonic fluid atomization device (See Fedorov, A. and Meacham, J. M., Evaporation-enhanced, dynamically-adaptive air (gas)-cooled heat sink for thermal management of high heat dissipation devices, Proceedings of ITherm 2008, Orlando, Fla., USA May 28-31, 2008).

A schematic of the proposed thermal management device is shown in FIG. 4. The device architecture modifies a conventional air (gas)-cooled heat sink by capping the finned structure of the heat sink with a multiplexed, planar droplet ejector array. In the embodiment shown in FIG. 4, the ejector array is placed below the heat sink; however, orientation is unimportant provided the ejected droplets have sufficient lift-off velocity to be entrained by the gas flow. Such a minimal modification of the heat sink allows one to exploit high heat flux evaporative cooling via delivery of streams of ultra-fine liquid droplets or jets to the highly thermally conducting, heat spreading surface of the heat sink fins. The droplets are entrained and carried by the primary air flow supplied by a fan. This carrier gas-enabled delivery of liquid droplets not only allows for high velocity droplet impingement onto the finned surface, thus enhancing convective heat transfer to the evaporating liquid, but also results in more uniform spreading of the droplet impingement zone over the extended surface of the heat sink. The finned surface of the heat sink can be made (super)hydrophilic, e.g., via surface texturing, to further improve droplet spreading and making a thin liquid film to promote liquid coolant evaporation. In addition, the planar structure of the atomization device placed below the heat sink effectively forms a capping lid to prevent parasitic air bypass of the heat sink finned area. Lastly, one other key attractive feature of the proposed technology, in addition to cooling enhancement, is the ease of its practical implementation (i.e., modification of commercially available heat sinks), provided a power-efficient, low-cost, multiplexed fluid atomization device of suitable dimensions exists.

Multiplexed Atomizer for Mist Generation and Delivery

Figure 5:
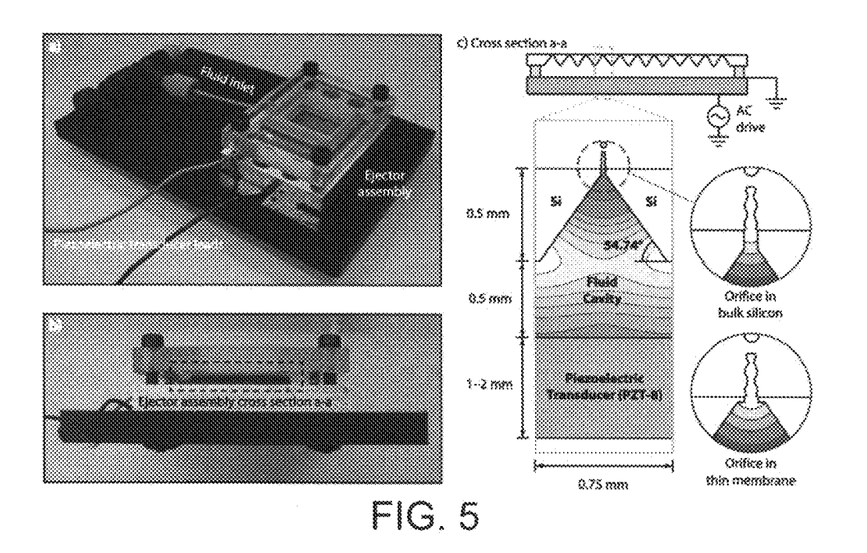
FIG. 5a illustrates a digital image of an ejector/spacer/transducer assembly sandwiched between pieces of plexiglass and aluminum (fluid inlet and piezoelectric transducer leads are also shown).
FIG. 5b illustrates a digital image of an end view of ejector assembly with cross section a-a highlighted.
FIG. 5c illustrates a schematic showing the geometry of ejector assembly cross section a-a, including representative dimensions and representations of orifices in both bulk silicon and thin membranes as well as distribution of the acoustic pressure field within the fluid cavities resulting in droplet/jet ejection.
Figure 6:
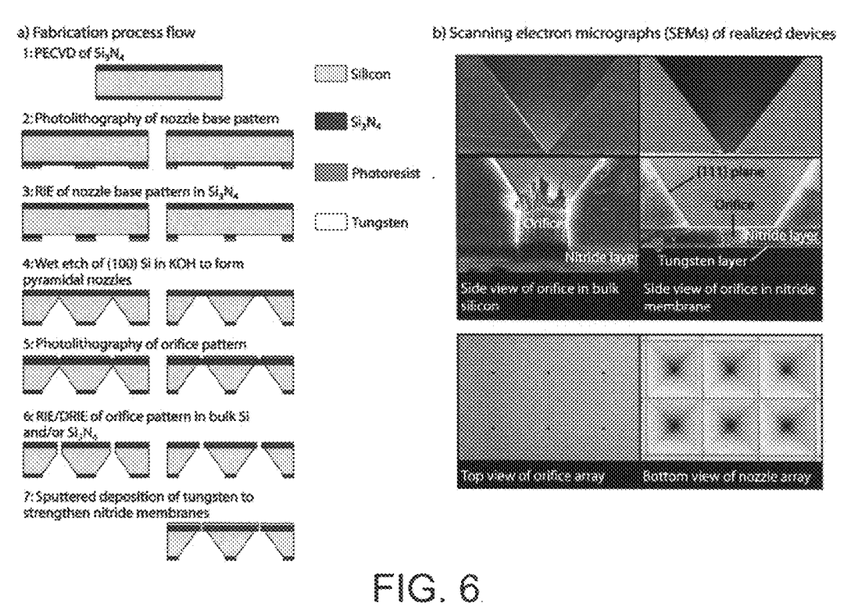
FIG. 6 illustrates the fabrication of an illustrative device.
Figure 7:
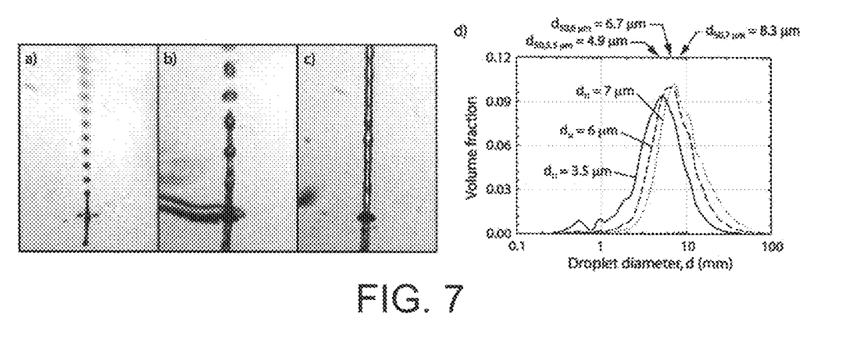
FIG. 7a-7c illustrates the stroboscopic images showing ejection of water from a 4.5 µm diameter orifice etched in an 11 µm wide square membrane in (a) discrete-droplet, (b) transition and (c) continuous-jet modes.
FIG. 7d is a graph that illustrates the aerosol size distributions for ejectors with varying orifice sizes measured by laser diffraction.
Figure 8:
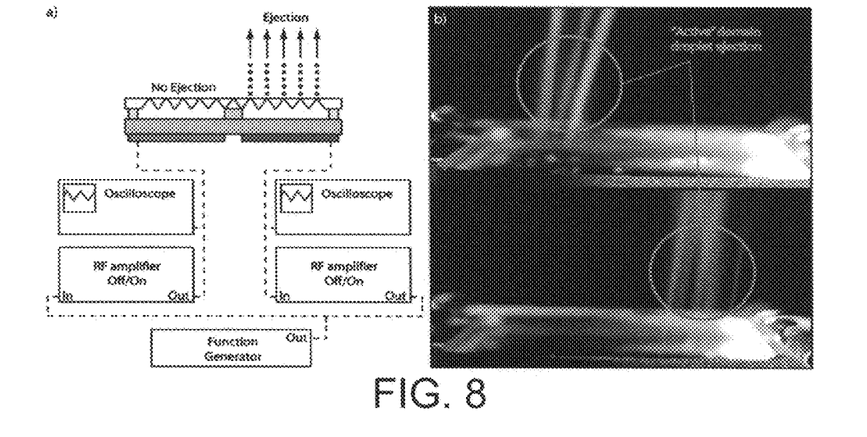
FIG. 8 illustrates representative multiplexing experiments showing spatially-selective droplet ejection.

The proposed thermal management device (FIG. 4) utilizes an array of ejectors capable of on-demand generation of a mist of droplets of suitable size. Several devices that realize droplet/jet impingement cooling and are suitable for heat sink-level integration have recently been demonstrated, including an orientation-independent configuration with an integrated vapor collection and condensation chamber; however, upon critical assessment of the above mentioned atomizers, the micromachined ultrasonic ejector array that we have been developing over the last four years appears to offer the most optimal combination of performance and geometric characteristics for the application at hand. FIG. 5 depicts features of the ultrasonic droplet generator array we utilized in demonstrating the concept of the proposed evaporation-enhanced air cooling scheme. Its capabilities, which are uniquely suitable for electronics cooling applications, are summarized below:

- Controlled ejection of multiple droplet streams or jets of uniform diameter between 5 and 50 μm
- Multiplexed operation of the array for on-demand cooling of spatially distributed thermal loads
- Low power consumption (combined pumping and ejection by the same device) with less than 100 mW power input
- Fast start-up and shut-down (~1 μsec) to respond to transient thermal loads
- Large dynamic range of variation in delivered coolant flow rates from μL/min to mL/min
- Simple and low cost CMOS-compatible MEMS fabrication of ejector array in silicon
- High droplet ejection velocity of 5-25 m/s, which is controlled independently of the flow rate
- Suitable for operation using non-dielectric (e.g., water) and dielectric (FC-72) fluids
- Device operation independent of orientation relative to the gravity field The ultrasonic ejector consists of a piezoelectric transducer, a fluid chamber, and a nozzle plate array micromachined in silicon (FIG. 5). It generates liquid droplets by utilizing cavity resonances in the 1-3 MHz range along with the acoustic wave focusing properties of liquid horns formed by a silicon wet etching process. At resonance, a standing acoustic wave is formed in the fluid reservoir with the peak pressure gradient occurring at the tip of the nozzle leading to sample ejection. Although a number of horn shapes are capable of focusing acoustic waves, we chose the pyramidal shape as it can be readily fabricated via a single step potassium hydroxide (KOH) wet etch of [100]-oriented silicon. As shown in FIG. 6a, when square patterns, which have edges aligned to the <110> direction of a [100]-oriented silicon wafer, are opened in a masking layer of silicon nitride (FIG. 6a steps 2 and 3) and exposed to a solution of KOH, the {100} planes are etched more rapidly than the {111} planes. This yields a pyramidal horn (FIG. 6a step 4) that makes a 54.74° angle with the plane of the wafer. The pyramid base size is designed so that the tip of these focusing pyramidal horns terminates near the opposite surface of the silicon wafer. As the last step of the process, nozzle orifices of a desired diameter (5-50 µm used in the various versions of the device) are formed by dry etching through the remaining silicon or a nitride membrane located at the opposite side of the silicon wafer using either deep reactive ion etching (DRIE) or reactive ion etching (RIE) in an inductively coupled plasma (ICP) machine (FIG. 6a steps 5 and 6). As shown in SEMs (FIG. 6b), this simple process yields hundreds of ejector nozzles on a single silicon wafer We have used the prototype of the ultrasonic ejector array described above to eject a variety of liquids, including water and FC-72 to prove the robustness of the device operation. It is important to point out one unique dimension to the ultrasonic ejector array—its selective operation in either drop-on-demand (DOD) or continuous-jet-ejection mode. These different modes of operation can accommodate the requirements of a specific task such as droplet-to-heat sink contact time, coolant consumption, etc. Careful stroboscopic visualization of the ejection process (FIG. 7a-7c) has allowed us to identify the relationship between the orifice diameter, frequency and amplitude of the driving AC signal that differentiates these ejection modes. The produced droplets or jet (FIG. 7a-7c) are highly uniform in size, which is an important consideration for achieving efficient and reproducible cooling performance. Three different devices with a range of orifice sizes (3.5, 6 and 7 µm) have been evaluated using a Malvern Instruments Spraytec laser diffraction droplet sizing instrument. FIG. 7d summarizes the results of this analysis with probing done at approximately 2 cm above the ejector surface. Each of the tested devices exhibited a mass mean diameter ($d_{50}$) that is a factor of 1.1 to 1.4 larger than the nominal nozzle orifice size ($d_o$), indicating that the distribution of the droplet sizes can be well controlled by the diameter of the nozzle orifice. The mass mean diameter is the diameter below which 50% by volume of the droplets in a spray are found.

The ejector is a resonant device that exploits operation at judiciously matched resonant frequencies of the array of liquid horns and the piezoelectric transducer to enable low-power operation, which is an important consideration, especially for field portable applications. In our most recent experiments, the device was operated with a pi-matching circuit, and one of the most active cavity resonances was moved closer to the natural longitudinal resonance of the piezoelectric transducer. Impedance data for a water-loaded device was used to find that the current drawn by the ejector was 37 mA at a voltage of 2.3 $V_{RMS}$ applied across the piezoelectric transducer. At a power consumption of only 85 mW, stable ejection was achieved while maintaining the transducer temperature below 30° C. The device also possesses a self-pumping capability enabled by the flexing piezoelectric transducer, thus requiring no additional pump for continuous operation. The device has a very fast transient response because of the high frequency (f~1 MHz) of operation, and the flow rate can easily be modulated by varying the transducer duty cycle.

To demonstrate multiplexed operation of the device, experiments were conducted to show that ejection can be on-demand and isolated to a specified "active" domain. FIG. 5a shows a schematic of the setup used in the experiments. A single function generator supplied the AC signal used to drive sections of the piezoelectric transducer for both domains of the device. This signal was amplified using an RF power amplifier and selectively applied to the electrode of the piezoelectric transducer in the "active" domain where ejection was desired, whereas the other set of electrodes was grounded. The operational multiplexed device has successfully achieved isolated ejection from an "active" sub-domain of the fluid reservoir with no ejection from the "inactive" domain. In demonstration experiments, the RF signal was applied to each sub-domain successively and alternated multiple times to ensure repeatable switching of ejection from one sub-domain to another (FIG. 8b).

Experimental Characterization of Cooling Performance

Figure 9:
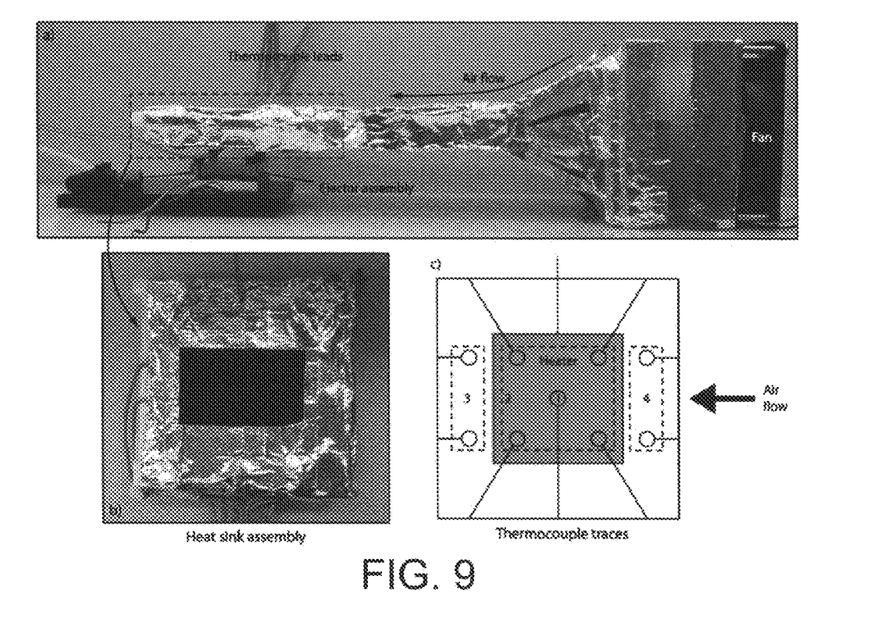
FIG. 9 illustrates the experimental setup for evaluation of performance enhancement via evaporative cooling.

We have experimentally investigated the cooling performance of a prototype device in comparison with conventional air cooling. The experimental setup shown in FIG. 9a consisted of a fan (model AFB0912HH, Delta) with a ducted outlet that directed air flow across a standard A6063 aluminum heat sink (model Z60-9.5B, Alpha Novatech, Inc.).

The heat sink featured an array of rectangular 9.5 mm high, 0.35 mm thick fins placed on the 60 mm×60 mm footprint area of the spreader plate. A 31.75 mm×31.75 mm Kapton (polyimide) Thermofoil™ flexible heater (model HK5587, 52.2Ω, 71 $W_{max}$, Minco) was attached to the middle section of the back side of the heat spreader using thermal paste (Omegatherm 201, Omega Engineering, Inc.) to emulate the power dissipated by an electronic device which requires cooling. Nine K-type thermocouples (Omega Engineering, Inc.) were inserted and then epoxied into grooves machined into the back side of the spreader for temperature measurements at the different locations shown in FIG. 9c. The entire heater-heat sink assembly was placed into a thermally insulating cradle and placed above the ejector assembly shown in FIG. 5. The converging tunnel at the outlet of the fan ensured that air flow was efficiently guided over the extended area of the heat sink. When comparing conventional air-cooling and heat dissipation with evaporative cooling enhancement using the ejector array, the power input to the fan was held constant to ensure a constant air flow rate for experiments with and without droplet ejection.

Figure 10:
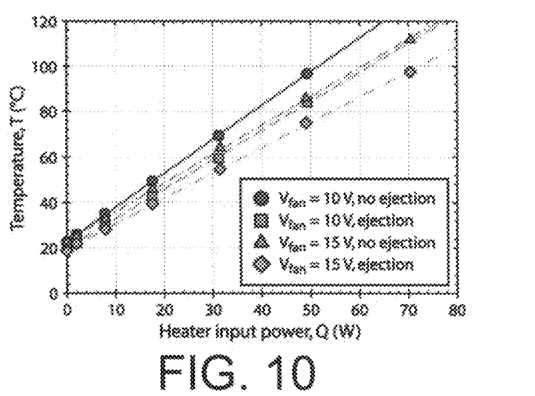
FIG. 10 is a graph showing the maximum heat sink temperature as a function of heater input power for four different experimental conditions: two different fan flow rate (input voltages 10 and 15 V) both with and without droplet/jet ejection

Two types of experiments have been performed to quantify the cooling performance enhancement afforded by intimate integration of single phase gas (air) and evaporative liquid (water) cooling: (1) evaluation of the degree of spreader sub-cooling for different power input levels when mist impingement evaporation is included, and (2) assessing the maximum improvement in power dissipation that can be expected using the evaporation-enhanced, air-cooled heat sink. For the first set of experiments, the ejector assembly was held at a distance of approximately 30 mm from the heat sink fins. The AC-voltage applied to the heater was increased in 10 $V_{RMS}$ increments both with and without droplet/jet impingement until the highest recorded temperature (location 1 in FIG. 9c) reaches the maximum allowed value of 85° C. even with evaporation enhancement. Experiments were conducted at fan input voltages of 10 and 15 V. Droplet/jet ejection was achieved by driving the piezoelectric transducer with a 55 $V_{pp}$, 970 kHz AC signal. The maximum temperature as a function of power input to the heater for each of these experimental conditions is shown in FIG. 10. For both fan input voltages, the maximum spreader temperature is reduced by approximately 15% with the introduction of mist impingement. Since the effective heat transfer coefficient is inversely proportional to the driving surface-to-air bulk temperature difference, the 15% translates into ~25-30% increase in an effective heat transfer coefficient for the cooling air supplied at $T_a$~23° C. Although this number represents a sizable improvement over conventional single phase gas cooling, it does not represent the maximum anticipated performance enhancement that can be achieved; the amplitude of the signal driving the piezoelectric transducer was held conservatively low to avoid excessive ejector assembly heating, and the cutout in the aluminum tape that confines the air flow to the heat spreader fins allows air to bypass the fins and push against the ejected droplets when the ejector is held at 30 mm from the fins. Nevertheless, FIG. 10 does suggest that significant performance enhancement might be achieved through further optimization of the heater/heat sink/ejector assembly configuration. In addition, only approximately one quarter of the finned surface right in the middle of the heat sink was exposed to impinging droplets, thus limiting the observed effect on the total dissipated power due to reduced surface area available for evaporative cooling. Since the total amount of power dissipated is proportional to available heat transfer area, one can extrapolate the results to anticipate that even with an un-optimized configuration used in this experiments cooling performance of the heat sink could be increased by as much as 100%. This would essentially double the thermal load that can be dissipated by the air-cooled heat sink, which would be a very significant gain in performance.

Figure 11:
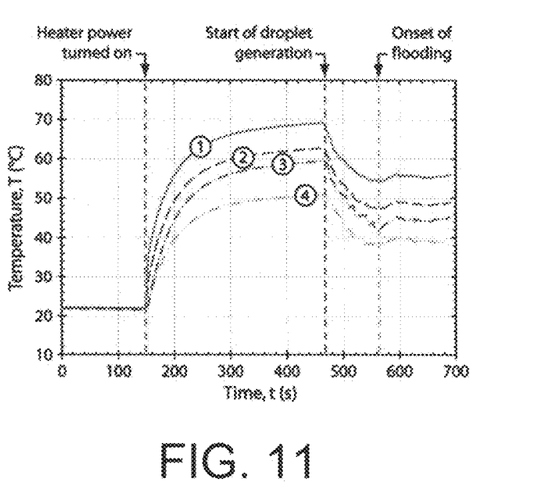
FIG. 11 is a graph showing the transient response of the system. The entire heat sink is initially at room temperature (~22.8° C.). The heat input is instantaneously increased from 0 to 31.3 W at 150 s and allowed to reach steady state. At t=470 s, mist impingement cooling is initiated. The heat sink temperature decreases until flooding of the fins results in a loss of performance enhancement. Lines 1, 2, 3 and 4 represent the maximum heat sink temperature, the average temperature of the five heater thermocouples and the averages of the thermocouples highlighted and labeled "3" and "4" in FIG. 9c, respectively.

In order to assess the maximum improvement in power dissipation that can be expected using the evaporation-enhanced, air-cooled heat sink, the experimental protocol described above was altered slightly. The amplitude of the piezoelectric transducer voltage input was increased to 100 $V_{pp}$ to increase the droplet ejection velocity, and the ejector assembly was manually held as close to the heat sink fins as possible (~15 mm) while moving the entire assembly back and forth below the fins to minimize liquid film condensation and flooding. This "experimental" arrangement would crudely mimic an optimal mode of operation of the device (FIG. 4) with the ejector placed in an intimate contact with the spreader fins and delivering the fluid for evaporation on the entire exposed surface of the heat sink. FIG. 11 shows the transient response of the air-cooled system (10 V fan input voltage) as the heat input is instantaneously increased from 0 to 31.3 W (40 $V_{RMS}$ heater input voltage) and allowed to reach steady state. Mist impingement is then turned on as is evident from the decrease in system temperature. The decrease in maximum heat sink surface temperature from 69° C. to 54° C. represents a 50% improvement in system performance (from 21 to 31.3 W heat dissipation at 54° C.), which is a significant performance enhancement; however, the system could perform better if not for flooding of the heat sink fins, which was visible via inspection during the experiment and is also seen as a slight increase in the maximum observed temperature to 56° C. in FIG. 11. This flooding is, of course, an unfortunate result of manual control of ejection process as well as un-optimized prototype of the heat sink with mismatched rates of the air and droplet flow rates and droplet placement. Upon careful optimization these drawbacks of our preliminary experiments should be easily overcome.

Practical Considerations & Applications

The liquid atomizer array, including the fluid reservoir, has a planar shape with very small thickness of ~3 mm (FIG. 5c), thus contributing very little additional volume to the baseline air-cooled heat sink. A seemingly bulky package shown in FIGS. 5a-5b is used only for convenience of laboratory investigation, and is not required in practical implementation of the device. As a result, the proposed concept should have an appeal to even space-constrained applications, provided the cooling system can operate in an open-loop with the coolant vapor discharge to ambient. On the other hand, in a closed-loop implementation with the evaporated liquid coolant collected off-chip at the condenser, consideration should be given to an additional contribution to the total system size due to presence of vapor condenser. However, there are numerous practical applications where the space is only constrained within the chip area and its immediate surroundings, which can readily accommodate a remote condenser at a convenient location.

There are two considerations associated with introducing a stream of liquid droplets into an air flow produced by the fan. First is a possible change of air flow pattern in the heat sink due to interactions with injected droplets. Because of the ultra-fine (~5 μm in diameter) and almost ideally uniform size of the mist produced by the atomizer, the droplets are readily entrained by the high velocity air stream with little effect on the air flow pattern. Second is an increase in the pressure drop, which would scale linearly with an increased volumetric flow rate due to evaporation of injected liquid droplets. This effect can be estimated using the following example. Consider a baseline air-cooled heat sink with the air flow mass flow rate $\dot{m}_a$, which enters the heat sink at ambient temperature $T_{in}$ (say 20° C.) and leaves at elevated temperature of $T_{out}$ (for example, 80° C.). The power dissipated by such an air-cooled heat sink is $\dot{Q}=\dot{m}_a c_p(T_{out}-T_{in})=\dot{V}_a\rho_a c_p(T_{out}-T_{in})$. Now, if one would like to double (i.e., increase by 100%) the heat dissipation capability of an air-cooled heat sink by adding evaporative cooling, then the mass flow rate of liquid coolant $\dot{m}_l$ required to achieve such an increase in power dissipation can be found from energy balance $\dot{V}_a\rho_a c_p(T_{out}-T_{in})=\dot{m}_l h_{fg}$. This, in turn, yields a volumetric flow rate of evaporated (gas phase) coolant added to the stream, computed as a fraction of the baseline air flow, $\dot{V}_v/\dot{V}_a=(\rho_a/\rho_v)\times c_p(T_{out}-T_{in})/h_{fg}$. Substituting the property values for air computed at its average temperature of 50° C. ($\rho_a$=1.078 kg/m³ and $c_p$=1.007 kJ/kg) and assuming saturated conditions for water vapor upon flash evaporation, evaluated at the heat sink surface temperature taken to be 85° C. ($\rho_v$=0.353 kg/m³ and $h_{fg}$=2,296 kJ/kg), yields that $\dot{V}_v/\dot{V}_a$=0.078, implying an ~8% increase in the total volumetric gas flow rate through the sink and an equivalent increase in the pressure drop. This small increase in a parasitic pressure drop is clearly manageable considering 100% improvement in the thermal performance. It should, however, be noted that this estimate is only an approximation, since our simplified analysis neglects additional cooling provided by sensible heating of the evaporated liquid coolant as it flows through the heat sink, discounts heat transfer augmentation for the gas (air+vapor) flow at an increased flow velocity, assumes that the heat sink surface temperature is uniform at 85° C., and also does not account for the fact that an additional (vapor) flow is being added incrementally along the length of the heat sink.

In a carefully optimized heat sink, all injected droplets are flash evaporated upon contact with the heat sink surface (owing to their very small size amenable for efficient thin film evaporation). As a result, what exits the heat sink is a purely gaseous stream consisting of air partially saturated with the coolant vapors, which can be either exhausted to the ambient environment (in an open-loop configuration) or routed through an externally-located condenser/cold-plate for liquid coolant recovery (in a closed-loop configuration). It should be noted that air flow pattern and velocity in the evaporation-enhanced heat sink may need to be modified as compared to the baseline air-only cooling configuration in order to achieve the best cooling performance for given pumping power constraints. Answering this important question requires further understanding of the heat and mass transfer interactions in this new cooling device and design optimization through complimentary experiments and simulations.

CONCLUSIONS

In this example we report on the development and performance characterization of the evaporation-enhanced air-cooled heat sink. In essence, our methodology and device design allows one to drastically "supercharge" a conventional air-cooled heat sink, thus extending its usability even for high demand thermal management applications. This is achieved by intimate integration of a heat spreader with an extended finned surface with a power efficient, multiplexed ejector array capable of on-demand, dynamically controlled delivery of liquid mist in single compact package. The preliminary experiments with a prototype device reveal significant gains in performance, including reduction in the heated surface temperature by ~15% and an increase in the total dissipated power by ~50%, as compared to the equivalent air-only cooled heat sink.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include ±1%, ±2%, ±3%, ±4%, ±5%, or ±10%, of the numerical value(s) being modified. In addition, the phrase "about 'x' to 'y'" includes "about 'x' to about 'y'".

Many variations and modifications may be made to the above-described embodiments. All such modifications and variations are intended to be included herein within the scope of this disclosure and protected by the following claims.

The invention claimed is:

1. A thermal management device, comprising:
 a heat dissipater structure disposed on a portion of a heat source structure, wherein the thermal energy from the heat source structure being able to heat at least a portion of the heat dissipater structure, wherein the heat dissipater structure has a heat dissipater surface;
 a fluid dispenser system adapted to direct fluid droplets towards the heat dissipater structure, wherein the fluid dispenser system is directly attached to the top of the heat dissipater structure at the end opposing the heat source structure, wherein the heat dissipater structure and fluid dispenser system define walls of a plurality of passages, wherein the fluid dispenser system is a top wall of the passages where the fluid dispenser system includes an ejector nozzle directed into the passage at a position on the top wall; and
 a gas flow system adapted to direct a gas towards the heat dissipater structure, wherein the gas being able to entrain the fluid droplets to form a gas/fluid droplet mixture, wherein the gas/fluid droplet mixture contacts the heat dissipater surface to dispose the fluid droplets onto the heat dissipater surface, and wherein the thermal energy from the heat dissipater surface is capable of being dissipated upon evaporation of the fluid droplets.

2. The thermal management device of claim 1, wherein the fluid droplets are water and the gas is air.

3. The thermal management device of claim 1, wherein the heat dissipater structure comprises fins, wherein the surface of the fins comprise at least a portion of the heat dissipater surface and wherein the fins form a first boundary of a passage.

4. The thermal management device of claim 1, wherein the fluid dispenser system is made of solid or porous materials selected from: copper, aluminum, silicon, diamond, steel, carbon, different polymers, or composite materials, or combinations thereof.

5. The thermal management device of claim 1, wherein the fluid dispenser system includes:
 a reservoir configured to store the fluid; and
 a planar ejector array structure disposed in communication with the reservoir configured to generate fluid droplets, wherein the planar ejector array structure forms a second boundary of a passage.

6. The thermal management device of claim 5, further comprising:
 an actuator disposed in communication with the reservoir configured to generate an ultrasonic pressure wave through the fluid, which causes fluid droplets to be ejected out of the planar ejector array structure,
 wherein the ejector structure includes at least one ejector nozzle configured to eject the fluid in response to the ultrasonic pressure wave, wherein each ejector structure is configured to focus the acoustic pressure wave at a tip of the ejector nozzle, wherein the reservoir is disposed between the actuator and the ejector structure, wherein the fluid droplets are ejected from the ejector nozzles of the ejector structures upon activation of the actuator.

7. The thermal management device of claim 6, wherein the actuator is selected from a piezoelectric actuator or a capacitive actuator.

8. The thermal management device of claim 1, wherein the fluid dispenser system includes:
 a reservoir configured to store the fluid; and
 an ejector system disposed in communication with the reservoir configured to generate fluid droplets, wherein the ejector system forms a second boundary of a passage.

9. The thermal management device of claim 1, wherein the thermal management device is a closed loop system.

10. The thermal management device of claim 1, wherein the gas flow system includes a fan.

11. The thermal management device of claim 1, wherein the heat generating structure is selected from an electronic component, a display, an engine, a fuel cell, a power generation device, a chemical reactor, or a light source.

12. The thermal management device of claim 1, wherein the heat generating structure is a computer chip.

13. The thermal management device of claim 1, wherein the fluid dispenser system produces jets of fluid.

14. The thermal management device of claim 1, wherein a gas flow system includes a fan, a synthetic jet, a piezoelectric fan, or an ionic flow generator.

15. The thermal management device of claim 1, wherein the heat source structure is connected to the heat dissipater structure via a thermal-fluidic conduit.

16. The thermal management device of claim 1, wherein the fluid dispenser system caps or substantially encloses the heat dissipater structure.

17. The thermal management device of claim 1, wherein the fluid droplets are a refrigerant and the gas is nitrogen.

18. A method of dissipating heat in a heat source structure, comprising:
- disposing a thermal management system adjacent the heat source structure, wherein the thermal management system includes:
  - a heat dissipater structure disposed on a portion of the heat source structure, wherein the thermal energy from the heat source structure heats at least a portion of the heat dissipater structure, wherein the heat dissipater structure has a heat dissipater surface;
  - a fluid dispenser system adapted to direct fluid droplets towards the heat dissipater structure, wherein the fluid dispenser system is directly attached to the top of the heat dissipater structure at the end opposing the heat source structure, wherein the heat dissipater structure and fluid dispenser system define walls of a plurality of passages, wherein the fluid dispenser system is a top wall of the passages where the fluid dispenser system includes an ejector nozzle directed into the passage at a position on the top wall; and
  - a gas flow system adapted to direct a gas towards the heat dissipater structure;
- ejecting the fluid droplets from the ejector nozzle directly into the passage at a position on the top wall;
- entraining the fluid droplets in the gas to form a gas/fluid droplet mixture in a passage; and
- directing the gas/fluid droplet mixture towards the heat dissipater structure, wherein the gas/fluid droplet mixture contacts the heat dissipater surface and the fluid droplets are disposed onto the heat dissipater surface, and wherein the thermal energy from the heat dissipater surface is dissipated and causes the fluid droplets to evaporate.

19. The method of claim 18, wherein the fluid dispenser system includes: a reservoir configured to store the fluid; and an ejector system disposed in communication with the reservoir configured to generate fluid droplets; and further comprising:
- ejecting the fluid droplets from the ejector system into a passage.

20. The method of claim 18, wherein the fluid dispenser system includes: a reservoir configured to store the fluid; and a planar ejector array structure disposed in communication with the reservoir configured to generate fluid droplets; and further comprising:
- ejecting the fluid droplets from the ejector system into a passage.

21. The method of claim 20, wherein the fluid dispenser system includes:
- an actuator disposed in communication with the reservoir configured to generate an ultrasonic pressure wave through the fluid, which causes fluid droplets to be ejected out of the planar ejector array structure,
- wherein the ejector structure includes at least one ejector nozzle configured to eject the fluid in response to the ultrasonic pressure wave, wherein each ejector structure is configured to focus the acoustic pressure wave at a tip of the ejector nozzle, wherein the reservoir is disposed between the actuator and the ejector structure, wherein the fluid droplets are ejected from the ejector nozzles of the ejector structures upon activation of the actuator; and further comprising:
- activating the actuator to generate the ultrasonic pressure wave for forcing the fluid through the ejector nozzle; and
- ejecting the fluid through the ejector nozzle to produce fluid droplets in a passage.

22. The method of claim 21, further comprising:
- focusing the ultrasonic pressure wave using the ejector structures.

23. The method of claim 18, wherein the heat generating structure is selected from an electronic component, a display, an engine, a fuel cell, a power generation device, a chemical reactor, or a light source.

24. The method of claim 18, wherein the fluid is water and the gas is air.

25. The method of claim 18, further comprising:
- collecting the evaporated fluid droplets, the gas, and the gas/fluid droplet mixture; and
- condensing the fluid to separate the gas from the fluid.

26. The method of claim 25, further comprising:
- re-circulating the fluid.

27. The method of claim 25, further comprising:
- re-circulating the gas.

28. The method of claim 18, further comprising:
- discharging the evaporated fluid and the gas/fluid droplet mixture to the ambient.

29. The method of claim 18, further comprising:
- matching the fluid droplet ejection to the thermal energy dissipation as a function of time and location on the heat source structure.

* * * * *